(12) United States Patent
Liang et al.

(10) Patent No.: US 12,035,100 B2
(45) Date of Patent: Jul. 9, 2024

(54) ELECTRONIC DEVICE AND CONTROL METHOD FOR GENERATING SOUND AND VIBRATION THROUGH VIBRATION OF DISPLAY

(71) Applicant: InnoLux Corporation, Miao-Li County (TW)

(72) Inventors: Ting-Wei Liang, Miao-Li County (TW); Shun-Cheng Chen, Miao-Li County (TW); Jiunn-Shyong Lin, Miao-Li County (TW); I-An Yao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 45 days.

(21) Appl. No.: 17/840,050

(22) Filed: Jun. 14, 2022

(65) Prior Publication Data
US 2023/0017259 A1 Jan. 19, 2023

(30) Foreign Application Priority Data
Jul. 13, 2021 (CN) .......................... 202110787967.9

(51) Int. Cl.
*H04R 1/28* (2006.01)
*G06F 3/01* (2006.01)
(Continued)

(52) U.S. Cl.
CPC ........... *H04R 1/2811* (2013.01); *G06F 3/016* (2013.01); *H04R 1/025* (2013.01); *H04R 1/028* (2013.01);
(Continued)

(58) Field of Classification Search
CPC ...... H04R 1/2811; H04R 1/025; H04R 1/028; H04R 1/288; H04R 17/00; H04R 2400/03;
(Continued)

(56) References Cited

U.S. PATENT DOCUMENTS

| | | | |
|---|---|---|---|
| 8,363,863 B2 * | 1/2013 | Andoh | H10N 30/857 381/152 |
| 10,802,635 B2 * | 10/2020 | Jung | G06F 1/1688 |
| 10,824,277 B2 * | 11/2020 | Tsai | H04R 5/033 |
| 11,012,781 B2 | 5/2021 | Kang et al. | |

(Continued)

FOREIGN PATENT DOCUMENTS

| | | | | |
|---|---|---|---|---|
| CN | 110196650 A | 9/2019 | | |
| EP | 3725424 A1 * | 10/2020 | ............. | B06B 1/045 |

(Continued)

OTHER PUBLICATIONS

Chinese language office action dated Dec. 31, 2022, issued in application No. TW 111111337.

*Primary Examiner* — Oyesola C Ojo
(74) *Attorney, Agent, or Firm* — McClure, Qualey & Rodack, LLP (57) ABSTRACT

An electronic device includes a display element, a piezoelectric element, and a cushioning element. The display element has a display surface and a non-display surface opposite to the display surface. The piezoelectric element is disposed on the non-display surface. The cushioning element is disposed between the display element and the piezoelectric element, and a space is surrounded by the display element, the piezoelectric element, and the cushioning element.

19 Claims, 8 Drawing Sheets

(51) Int. Cl.
    *H04R 1/02*          (2006.01)
    *H04R 17/00*        (2006.01)
    *H10N 30/87*        (2023.01)

(52) U.S. Cl.
    CPC .............. *H04R 1/288* (2013.01); *H04R 17/00* (2013.01); *H10N 30/871* (2023.02); *H04R 2400/03* (2013.01); *H04R 2499/15* (2013.01)

(58) Field of Classification Search
    CPC ...... H04R 2499/15; H04R 7/10; H04R 7/045; H04R 7/06; H04R 3/00; G06F 3/016; G06F 3/03547; H10N 30/871; H10N 30/2047
    See application file for complete search history.

(56) References Cited

U.S. PATENT DOCUMENTS

| | | | |
|---|---|---|---|
| 11,262,862 B2 | 3/2022 | Jung et al. | |
| 2012/0162143 A1* | 6/2012 | Kai | H04M 1/0266 345/177 |
| 2016/0334843 A1* | 11/2016 | Uto | G06F 3/0443 |
| 2020/0171542 A1* | 6/2020 | Kho | B06B 1/0629 |
| 2022/0058989 A1* | 2/2022 | Chen | G06F 1/1626 |

FOREIGN PATENT DOCUMENTS

| | | | | |
|---|---|---|---|---|
| JP | 2010141397 A | * | 6/2010 | ............ H04R 17/00 |
| TW | 200950565 A | | 12/2009 | |
| TW | I661290 B | | 6/2019 | |
| TW | 202009566 A | | 3/2020 | |
| TW | 202018993 A | | 5/2020 | |
| WO | WO-2022258886 A2 | * | 12/2022 | ............ G06F 3/016 |

\* cited by examiner

ELECTRONIC DEVICE AND CONTROL METHOD FOR GENERATING SOUND AND VIBRATION THROUGH VIBRATION OF DISPLAY

CROSS REFERENCE TO RELATED APPLICATIONS

This Application claims priority of China Patent Application No. 202110787967.9, filed on Jul. 13, 2021, the entirety of which is incorporated by reference herein.

BACKGROUND OF THE INVENTION

Field of the Invention

The present disclosure is related to an electronic device and a control method, and more particularly it is related to an electronic device and a control method for generating sound and vibration feedback through the vibration of a display element.

Description of the Related Art

Most current models of mobile phones and other mobile communication devices are designed to have separate sound-generating devices and vibrating devices, which use different components. Since a component device has a certain thickness, the types of components used in the sound-generating device and the vibrating device are basically large actuators or vibration motors, which are relatively thick. Because consumers demand thinner and lighter mobile communication devices, designers must optimize the volume of the sound-generating device and the vibrating device in order to reduce the overall size of the mobile communication device.

BRIEF SUMMARY OF THE INVENTION

To address the issues mentioned above, the disclosure provides an electronic device including a display element, a piezoelectric element, and a cushioning element. The display element has a display surface and a non-display surface, wherein the non-display surface faces away from the display surface. The piezoelectric element is disposed on the non-display surface. The cushioning element is disposed between the display element and the piezoelectric element. A space is surrounded by the display element, the piezoelectric element, and the cushioning element.

The disclosure further provides a control method. The control method comprises providing an electronic device comprising a piezoelectric element; receiving an audio signal and a haptic signal to generate a control signal; and generating sound and vibration corresponding to the audio signal and the haptic signal respectively by using the piezoelectric element.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It would be understood that, in the description herein and throughout the claims that follow, although the terms "first," "second," etc. may be used to describe various elements, these elements should not be limited by these terms. These terms are only used to distinguish one element from another. For example, a first element could be termed a second element, and, similarly, a second element could be termed a first element, without departing from the scope of the embodiments.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 1:
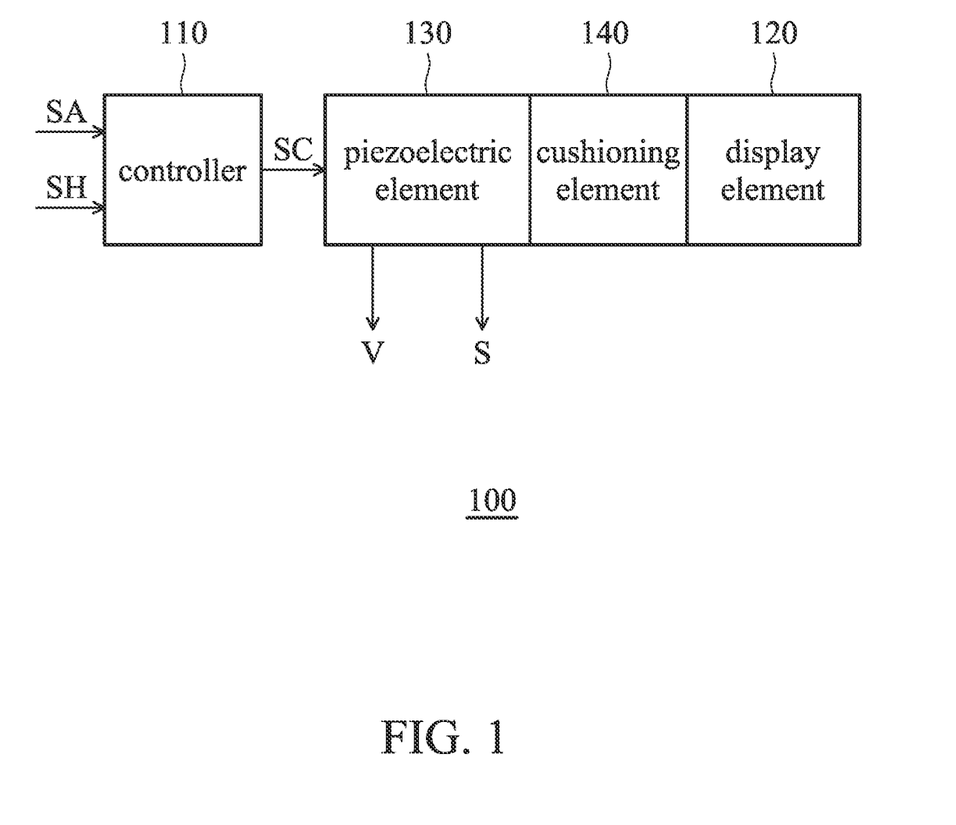
FIG. 1 is a block diagram of an electronic device in accordance with an embodiment of the disclosure.

FIG. 1 is a block diagram of an electronic device in accordance with an embodiment of the disclosure. As shown in FIG. 1, the electronic device 100 includes a display element 120, a piezoelectric element 130, and a cushioning element 140. According to some embodiments of the disclosure, the electronic device 100 further includes a controller 110 that receives the audio signal SA and the vibration signal SH to generate the control signal SC, and provides the control signal SC to the piezoelectric element 130. According to some embodiments of the disclosure, the electronic device 100 is located in a mobile communication device, in which the central processing unit of the mobile communication device sends the audio signal SA and the vibration signal SH to the controller 110. According to other embodiments of the disclosure, the electronic device 100 may be located in other electronic products that are required to emit sound and vibration. In some embodiments, the electronic device 100 may be a display device, a sensing device, a touch device, a curved device, a titled device, or a free shape device. The device may also be a bendable or flexible splicing device, but is not intended to be limited thereto.

Figure 2A:
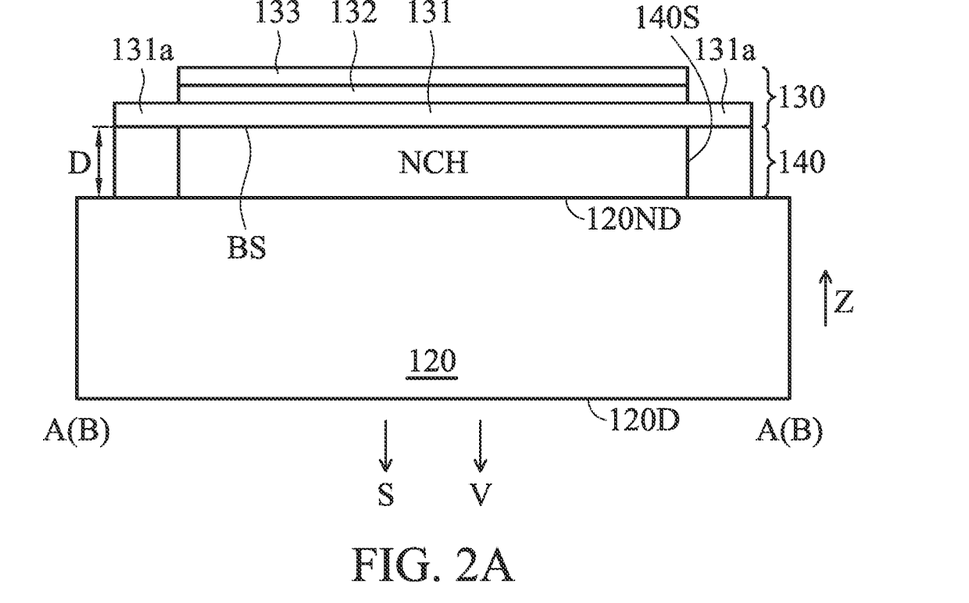
FIGS. 2A-2B are a cross-sectional view of an electronic device in accordance with some embodiments of the disclosure.

FIG. 2A is a cross-sectional view of an electronic device 100 in accordance with an embodiment of the disclosure. The display element 120 has a display surface 120D and a non-display surface 120ND, in which the non-display surface 120ND faces away from the display surface 120D. The non-display surface 120ND and the display surface 120D are arranged along a first direction (Z direction). The image can be displayed on the display surface 120D. The piezoelectric element 130 is disposed on the non-display surface 120ND of the display element 120, and generates sound S and vibration V corresponding to the audio signal SA and the vibration signal SH respectively according to the control signal SC generated by the controller 110. Along the first direction (Z direction), the cushioning element 140 is disposed between the display element 120 and the piezoelectric element 130, and there is a space NCH that is surrounded by the display element 120, the piezoelectric element 130, and the cushioning element 140. As shown in FIG. 2A, the cushioning element 140 is in a surrounding shape surrounding the space NCH. In more detail, the space NCH is surrounded by the display element 120, the piezoelectric element 130, and the inner surface 140S of the cushioning element 140. The vibration generated by the piezoelectric element 130 may provide haptic feedback to the electronic device 100.

In some embodiments, the display element 120 may include liquid crystal, organic light-emitting diode, inorganic light-emitting diode, quantum dots, fluorescent materials, phosphorescent materials, other suitable materials, or a combination of the above materials, but the disclosure is not limited thereto. Inorganic light-emitting diodes may include, for example, sub-millimeter light-emitting diodes (mini LEDs), micro light-emitting diodes (micro LEDs), or quantum dot light-emitting diodes (QLED/QDLED), but the disclosure is not limited thereto.

Figure 3A:
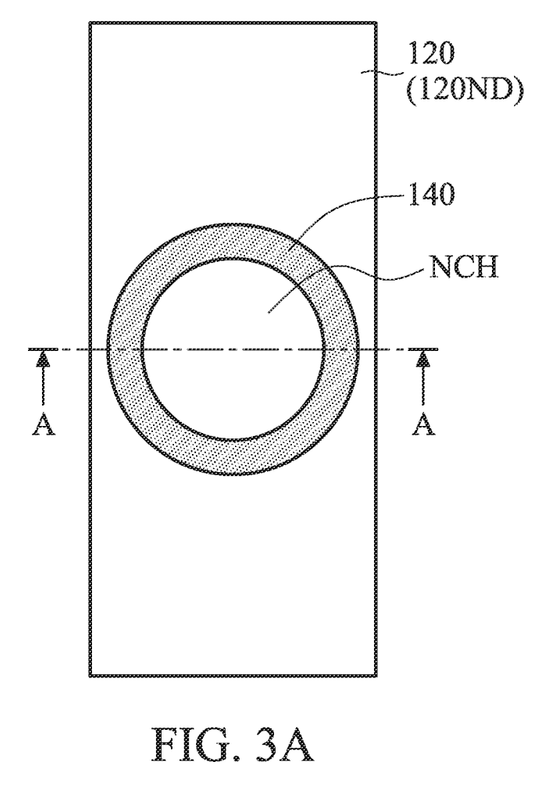
FIGS. 3A-3B are top views of cushioning units and a non-display surface in accordance with some embodiments of the disclosure.

FIG. 3A is a top view of the cushioning element 140 in accordance with an embodiment of the disclosure. FIG. 2A is a cross-sectional view along the section line A-A in FIG. 3A. For the convenience of description, FIG. 3A only shows the cushioning element 140. As shown in FIGS. 2A and 3A, the cushioning element 140 may be disposed on the non-display surface 120ND of the display element 120. The cushioning element 140 may have a surrounding shape surrounding the space NCH. For convenience of description, in FIG. 3A, the cushioning element 140 is circular, but the disclosure is not limited thereto. Although it is not shown in FIGS. 3A and 3B, the cushioning element 140 may be circular, elliptical, rectangular, square, arc . . . or any other shape. As shown in FIG. 3A, the cushioning element 140 may be a closed shape.

Figure 3B:
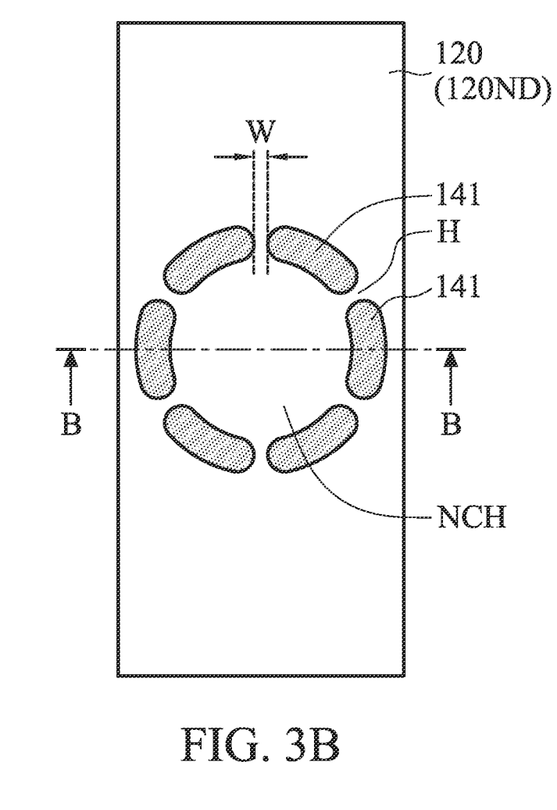

FIG. 3B is a top view of the cushioning element 140 in accordance with another embodiment of the disclosure. FIG. 2A may be a cross-sectional view along the section line B-B of FIG. 3B. For convenience of description, FIG. 3B only shows the cushioning element 140. As shown in FIGS. 2A and 3B, the cushioning element 140 has at least one sound hole H that may communicate with the space NCH. FIG. 3B illustrates that the cushioning element 140 has six sound holes H, but the disclosure is not limited thereto. An appropriate number of sound holes H may be designed according to requirements. The number of sound holes H may be 1 to 20, 1 to 10, 2 to 8, 2 to 6, or 2 to 4. The arrangement of the sound holes H may make the vibration wave (such as sound wave) more evenly transmitted to the entire electronic device. The number of sound holes H may be odd or even. However, the sound hole may not be necessary. According to some embodiments, as shown in FIG. 3A, the cushioning element 140 may be closed without any sound hole.

Referring to FIG. 3B again, the sound holes H of the cushioning element 140 may divide the cushioning element 140 into a plurality of cushioning units 141. For convenience of description, FIG. 3B illustrates six sound holes H, and the cushioning element 140 is divided into six cushioning units 141, but the disclosure is not limited thereto. An appropriate number of sound holes H and cushioning units 141 can be designed according to requirements. The sound holes H may have a width W. According to an embodiment of the disclosure, the width W is defined as the shortest distance between two of the cushioning units 141. The width W may be in the range of 0.5 millimeters (mm) to 50 mm. Alternatively, it may be in the range of 0.5 mm to 20 mm, it may be in the range of 1 mm to 15 mm, it may be in the range of 1 mm to 10 mm, it may be in the range of 1 mm to 5 mm. According to some embodiments of the disclosure, the number of sound holes H and the width W of the sound holes H of the cushioning element 140 can be designed according to requirements. According to some embodiments, there may be many sound holes H in the cushioning unit 141, and their widths may all be the same or different.

According to an embodiment of the disclosure, referring to FIG. 2A, the thickness D of the cushioning element 140 (or the cushioning units 141) may be 0.1 millimeters to 10 millimeters (mm), but it is not limited thereto. In some embodiments, the thickness D of the cushioning element 140 may be between 0.1 mm and 5 mm. In some embodiments, the thickness D of the cushioning element 140 may be between 0.1 mm and 1 mm, or may be between 0.1 mm and 0.9 mm. According to an embodiment of the disclosure, the height of the space NCH can be determined by the thickness D of the cushioning element 140. Therefore, the applicable thickness range of the space NCH may refer to the thickness range of the cushioning element 140, which is not repeated herein.

As shown in FIG. 2A, in detail, the piezoelectric element 130 may include a first electrode 131, a first piezoelectric material layer 132, and a second electrode 133. The first piezoelectric material layer 132 may be disposed between the first electrode 131 and the second electrode 133. Compared with the second electrode 133, the first electrode 131 is closer to the display element 120. The edge portion 131a of the first electrode 131 may cover the cushioning element 140. Therefore, the space NCH can be surrounded by the display element 120, the first electrode 131 of the piezoelectric element 130, and the cushioning element 140. According to an embodiment of the disclosure, when a voltage (e.g., an AC voltage) is applied to the first electrode 131 and the second electrode 133, the first piezoelectric material layer 132 can be vibrated along the first direction (Z direction), and then the display element 120 is driven to vibrate for emitting sound S and vibration V toward the display surface 120D. According to an embodiment of the disclosure, the thickness D of the cushioning element 140 can be defined as the thickness between the non-display surface 120ND and the bottom surface BS of the first electrode 131.

The vibration of sound and tactile feedback may be provided for the electronic device 100 by the vibration of the piezoelectric element 130. Therefore, it is not necessary to use the relatively bulky actuator or the vibration motor of the conventional electronic devices, so as to achieve the requirement of smaller size. Furthermore, since the sound is emitted from the display surface 120D of the display element 120, the position where the sound is emitted and the position where the image is displayed tends to be the same, which can further improve the user experience.

Figure 2B:
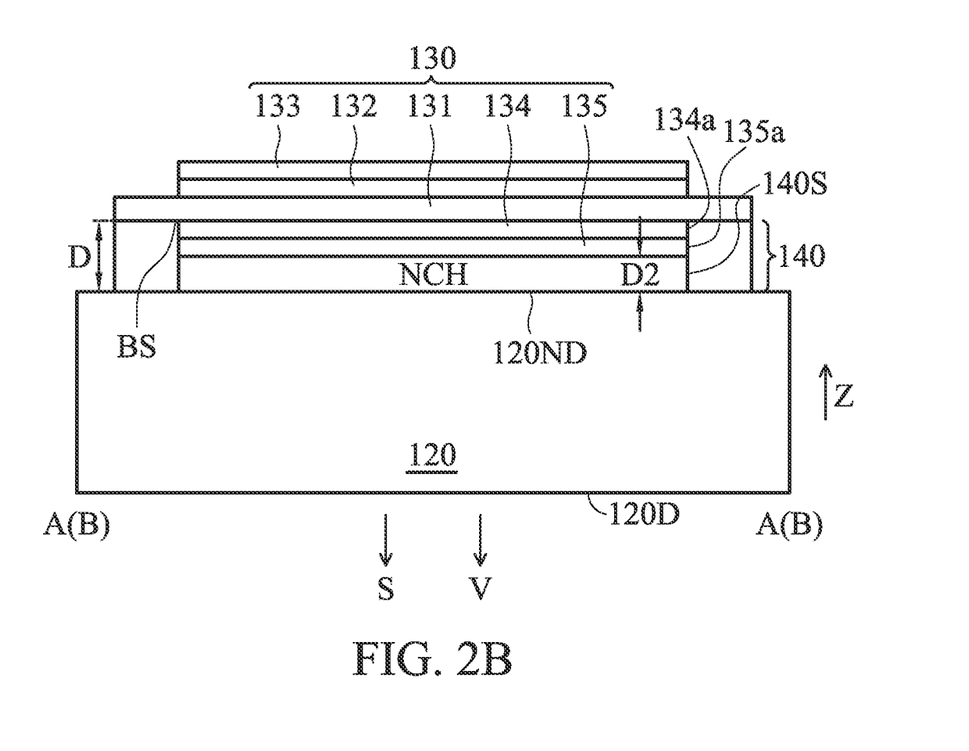

FIG. 2B is a cross-sectional view of an electronic device in accordance with another embodiment of the disclosure. FIG. 2B may be viewed from the section line A-A in FIG. 3A, or may be a cross-sectional view from the section line B-B in FIG. 3B. FIG. 2B is similar to FIG. 2A, except that the piezoelectric element 130 of FIG. 2B further includes a second piezoelectric material layer 134 and a third electrode 135. As shown in FIG. 2B, the second piezoelectric material layer 134 is disposed between the first electrode 131 and the third electrode 135. Compared with the first electrode 131, the third electrode 135 is closer to the display element 120. The first piezoelectric material layer 132 and the second piezoelectric material layer 134 are located on different sides of the first electrode 131 respectively. The second electrode 133 and the third electrode 135 are respectively located on different sides of the first electrode 131. As shown in FIG. 2B, the side surface 134a of the second piezoelectric material layer 134 and the side surface 135a of the third electrode 135 may contact the inner surface 140S of the cushioning element 140. The space NCH is surrounded by the display element 120, the third electrode 135 in the piezoelectric element 130, and the cushioning element 140. Therefore, as shown in FIG. 2B, the thickness D2 of the space NCH may be smaller than the thickness D of the cushioning element 140.

According to another embodiment of the disclosure, when a voltage (e.g., an alternating voltage) is applied to a pair of the first electrode 131 and the second electrode 133 respectively and a pair of the second electrode 133 and the third electrode 135 respectively, the first piezoelectric material layer 132 and the second piezoelectric material layer 134 may vibrate along the first direction (Z direction), thereby driving the display element 120 to vibrate to emit sound S and vibration V. Compared with FIG. 2A, since FIG. 2B has two piezoelectric material layers, a larger vibration amplitude may be generated, and thus a louder sound S and a more pronounced vibration V can be generated.

According to other embodiments of the disclosure, the piezoelectric element 130 may include any number of piezoelectric material layers according to actual needs, and the disclosure is not limited thereto. According to other embodiments, the piezoelectric element 130 may include any number of electrodes according to actual needs. For example, the piezoelectric element 130 may include a third piezoelectric material layer (not shown), and the third piezoelectric material layer may be disposed on the second electrode 133 on a side away from the display element 120. Alternatively, a third piezoelectric material layer (not shown) may be disposed on the third electrode 135 close to the side of the display element 120 to further reduce the thickness of the space NCH.

Figure 4:
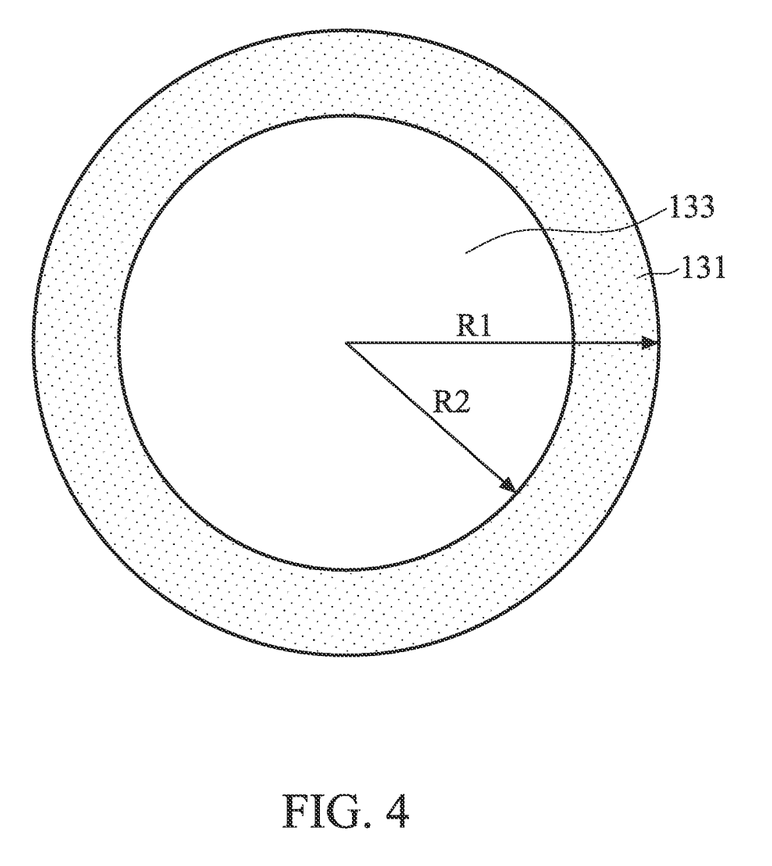
FIG. 4 is a top view of the first electrode and the second electrode in accordance with an embodiment of the disclosure.

FIG. 4 is a top view of the first electrode and the second electrode in accordance with an embodiment of the disclosure. As shown in FIG. 4, the first electrode 131 and the second electrode 133 may be circular, but the disclosure is not limited thereto. The shape of the first electrode 131 and the second electrode 133 may be various shapes such as circle, ellipse, rectangle, square, etc., but it is not limited thereto. According to some embodiments, the first electrode 131 and the second electrode 133 may be circular. As shown in FIG. 4, the first electrode 131 has a first radius R1, and the second electrode 133 has a second radius R2. According to an embodiment of the disclosure, the first radius R1 may be larger than the second radius R2. According to another embodiment of the disclosure, the first radius R1 may also be equal to the second radius R2. According to other embodiments of the disclosure, the first radius R1 may be smaller than the second radius R2.

Figure 5A:
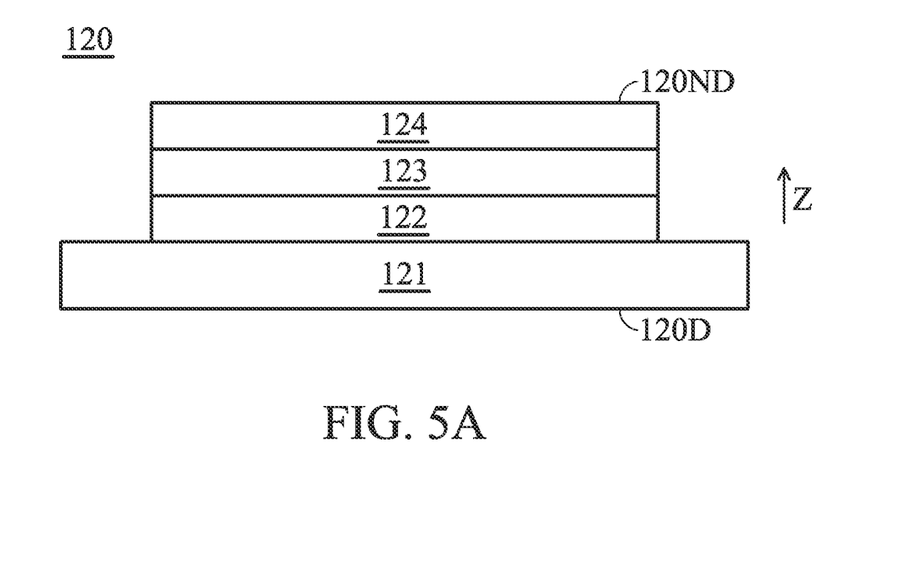
FIGS. 5A-5B are cross-sectional views of a display element in accordance with some embodiments of the disclosure.

FIGS. 5A and 5B are cross-sectional views of display elements in accordance with some embodiments of the disclosure. According to an embodiment of the disclosure, as shown in FIG. 5A, the display element 120 may include a cover plate 121, a touch layer 122, a display module 123, and a backlight module 124. The display surface 120D may be a surface of the cover plate 121. The non-display surface 120ND may be a surface of the backlight module 124. Along the direction toward the display surface 120D, the display module 123 may be disposed on the backlight module 124, and the cover plate 121 may be disposed on the display module 123. According to some embodiments, the display module 123 may be a liquid crystal display panel, and the backlight module 124 may provide a light source to the display module 123. Therefore, the electronic device may emit light toward the display surface 120D. Referring to FIG. 2A and FIG. 5A, a space NCH is surrounded by the backlight module 124 of the display element 120, the piezoelectric element 130, and the cushioning element 140. The backlight module 124 may include a backplane (not shown). In more detail, there is a space NCH that may be surrounded by the backplane of the backlight module 124, the electrodes of the piezoelectric element 130 (e.g., the first electrode 131), and the cushioning element 140. As shown in FIG. 5A, the touch layer 122 may be disposed on the display module 123. According to other embodiments (not shown in FIG. 5A), the touch layer may be disposed in the display module 123. For the convenience of description, the touch layer 122 is only shown as a single layer. According to some embodiments, the touch layer 122 may be a single layer or two layers, and may have a pattern (not shown). The cover plate 121 may protect the display module 12, which may be glass, plastic, or a combination thereof. According to an embodiment of the disclosure, the display element 120 in FIG. 5A corresponds to the display element 120 in FIGS. 1, 2A, and 2B.

Figure 5B:
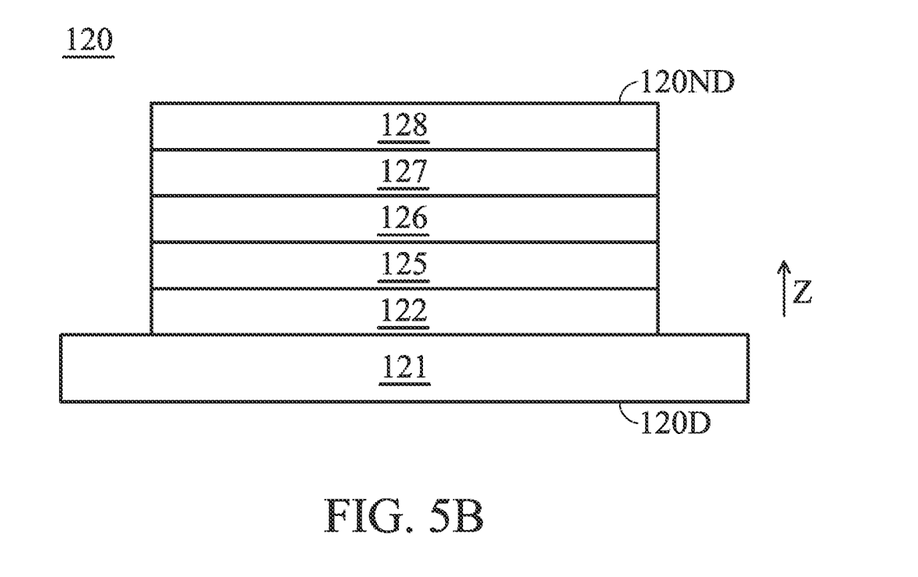

According to another embodiment of the disclosure, as shown in FIG. 5B, the display element 120 may be an organic light-emitting diode display device, which includes a cover plate 121, a touch layer 122, a polarizing layer 125, an encapsulation layer 126, the light-emitting layer 127, and the substrate 128. The cover plate 121 and the touch layer 122 may be the same as or similar to those shown in FIG. 5A, which will not be repeated herein.

As shown in FIG. 5B, the display surface 120D may be a surface of the cover plate 121, and the non-display surface 120ND may be a surface of the substrate 128. Along the direction toward the display surface 120D, the light-emitting layer 127 is disposed on the substrate 128, the encapsulation layer 126 is disposed on the light-emitting layer 127, the polarizing layer 125 is disposed on the encapsulation layer 126, and the cover plate 121 is disposed on the polarizing layer 125. The substrate 128 may include driving elements (not shown) to drive the light-emitting layer 127. According to some embodiments, the substrate 128 may be an array substrate, which may include transistors. According to an embodiment of the disclosure, the display element 120 in FIG. 5B may correspond to the display element 120 in FIGS. 1, 2A, and 2B.

Figure 7:
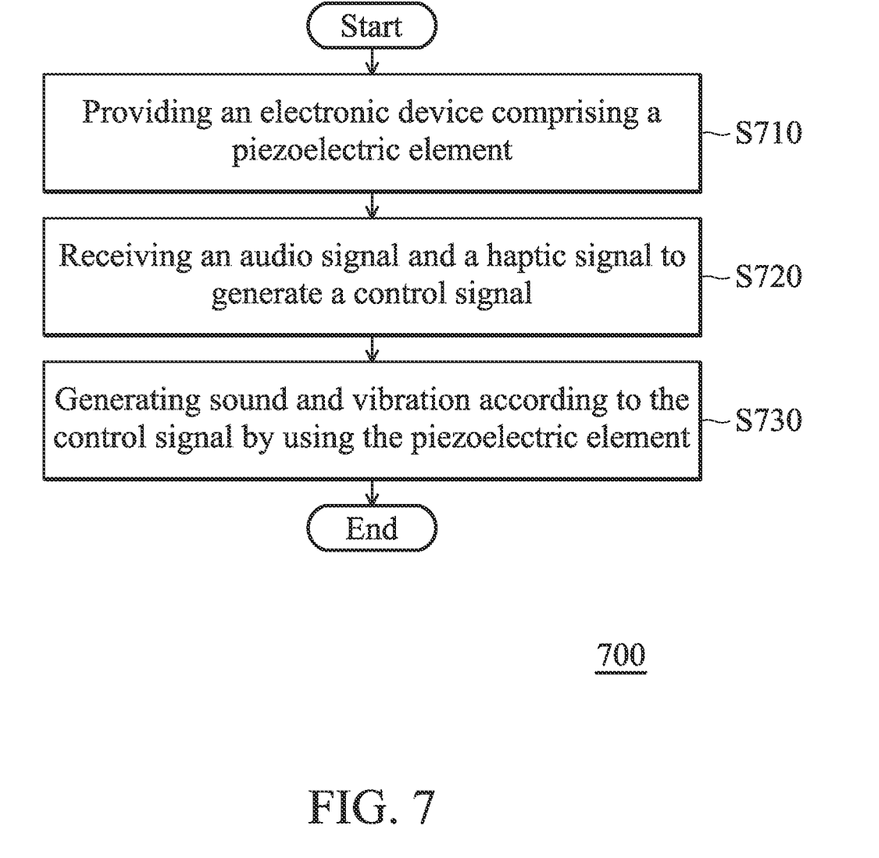
FIG. 7 is a flow chart of a control method in accordance with an embodiment of the disclosure.

FIG. 7 is a flow chart of a control method in accordance with an embodiment of the disclosure. The following description of the control method 700 in FIG. 7 will be referred to FIG. 1 and FIG. 7 for detailed description.

First, the electronic device 100 is provided, in which the electronic device 100 includes the piezoelectric element 130 (Step S710). Next, the electronic device 100 receives the audio signal SA and the vibration signal SH, and generates the control signal SC (Step S720). According to the control signal SC, the piezoelectric element 130 generates sound S and vibration V (Step S730).

Figure 6A:
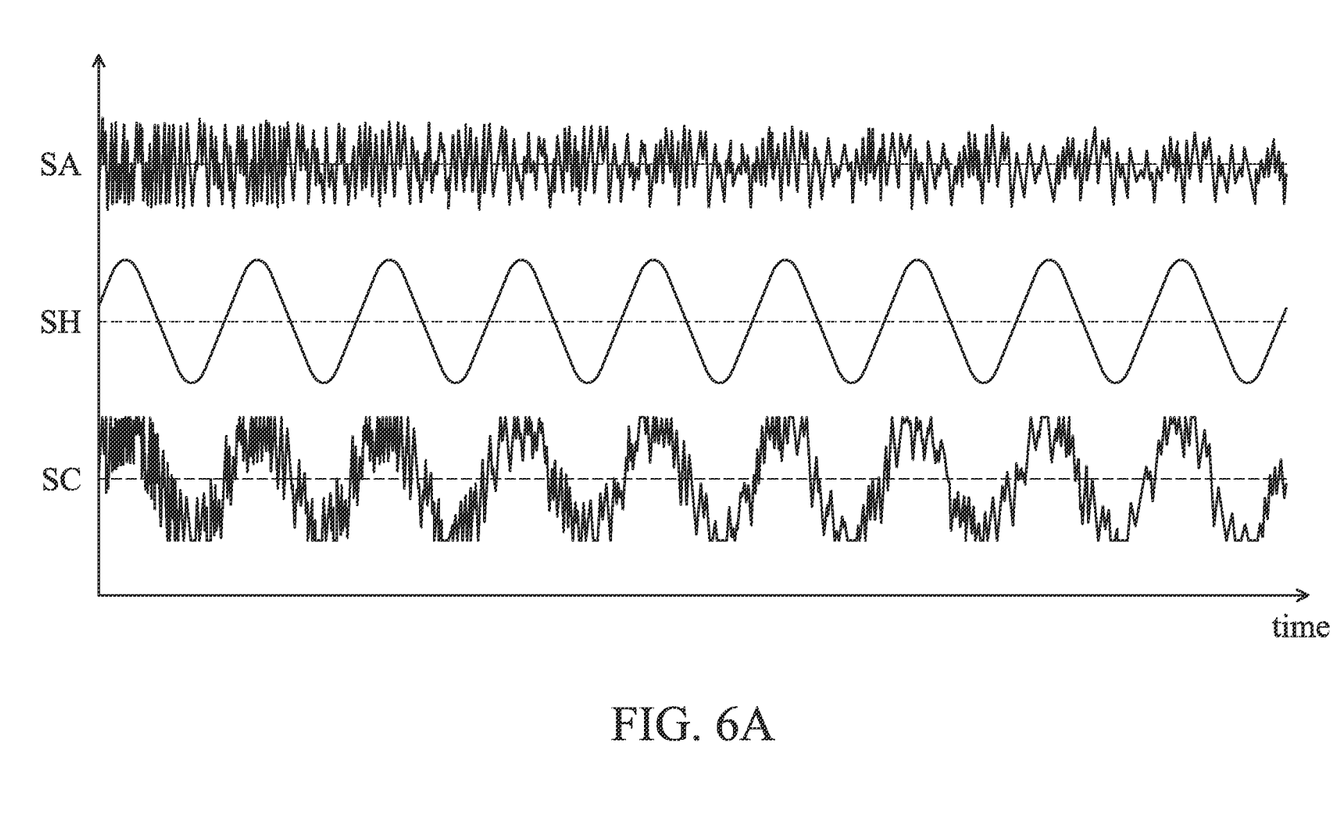
FIGS. 6A-6B are schematic diagrams of a superimposed synthetic audio signal and a vibration signal in accordance with some embodiments of the disclosure.

FIG. 6A is a schematic diagram of superimposing an audio signal and a vibration signal according to an embodiment of the present disclosure. Referring to FIG. 1 and FIG. 6A, the controller 110 of FIG. 1 superimposes the received audio signal SA and the haptic signal SH to generate the control signal SC. In other words, the control signal SC may be the result of the superposition of the audio signal SA and the haptic signal SH. Therefore, according to the control signal SC, the piezoelectric element 130 generates the sound S and the vibration V at the same time, and the sound S and the vibration V is transmitted to the user through the display surface 120D of the display element 120. The sound S and the vibration V correspond to the audio signal SA and the haptic signal SH, respectively. The waveform of the signal is not limited, which may be a sine wave, a square wave, a triangle wave . . . etc.

Figure 6B:
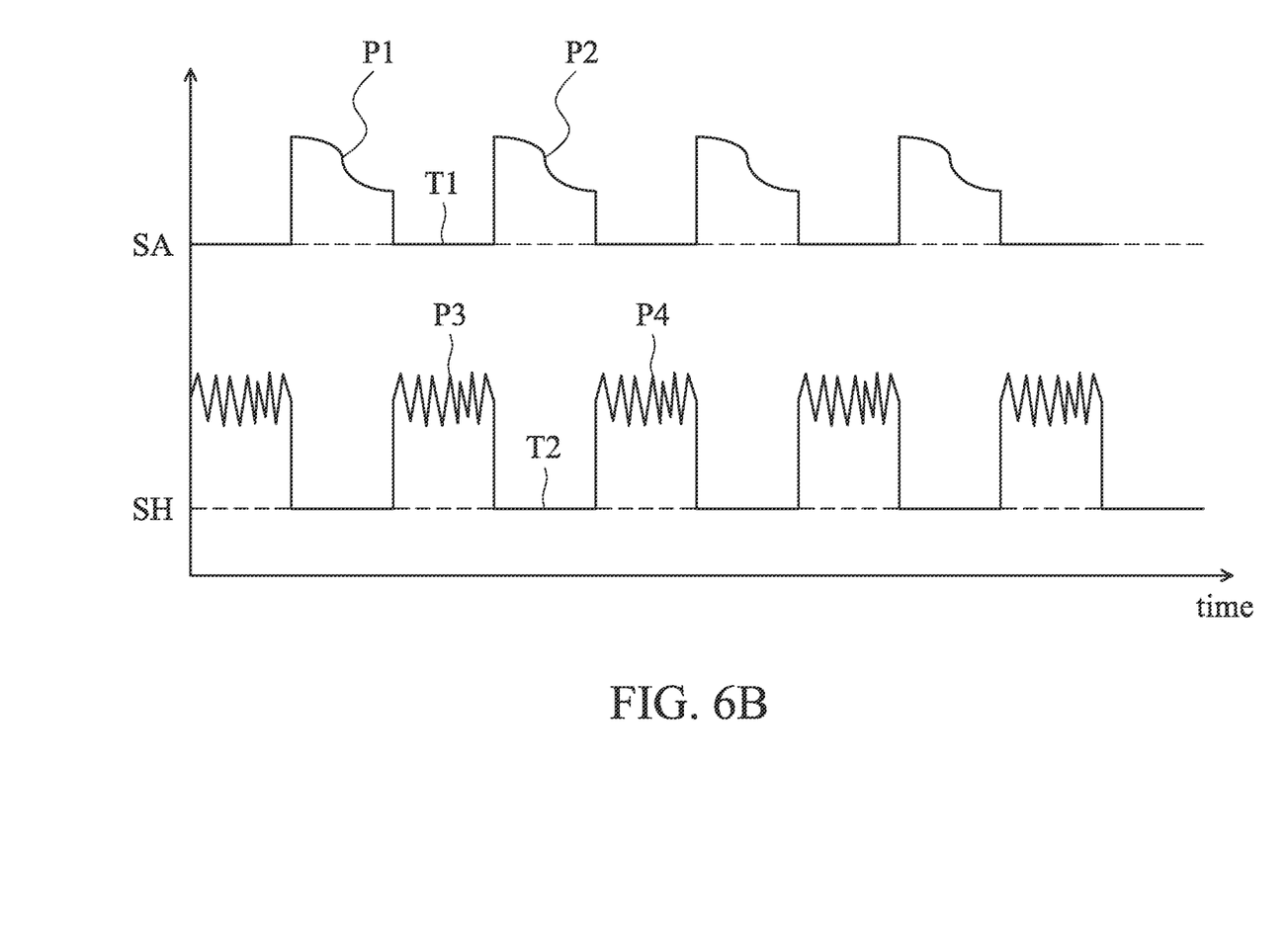

Referring to FIG. 1 and FIG. 6B, according to another embodiment of the disclosure, the controller 110 of FIG. 1 processes the received audio signal SA and haptic signal SH, so that the audio signal SA and the haptic signal SH are generated alternately. For example, as shown in FIG. 6B, the audio signal SA includes a first signal part P1 and a second signal part P2, and the haptic signal SH includes a third signal part P3 and a fourth signal part P4. In the order of time, they are the first signal part P1, the third signal part P3, the second signal part P2, and the fourth signal part P4. The waveform of the signal is not limited, which may be a sine wave, a square wave, a triangle wave . . . etc.

The first signal part P1 and a second signal part P2 may be separated by a first time period T1, and the third signal part P3 and a fourth signal part P4 may be separated by a second time period T2. The first time period T1 may be in the range of 5 milliseconds to 100 milliseconds, may be in the range of 5 milliseconds to 50 milliseconds, may be in the range of 10 milliseconds to 40 milliseconds, and may be in the range of 10 milliseconds to 30 milliseconds. Similarly, the first time period T2 may be in the range of 5 milliseconds to 100 milliseconds, may be in the range of 5 milliseconds to 50 milliseconds, may be in the range of 10 milliseconds to 40 milliseconds, and may be in the range of 10 milliseconds to 30 milliseconds. According to some embodiments, the above-mentioned first time period T1 and second time period T2 may be designed according to requirements. The first time period T1 and the second time period T2 may be the same or different. According to some embodiments, the first time period T1 may be less than the second time period T2. According to some embodiments, the first time period T1 may be greater than the second time period T2. According to an embodiment of the disclosure, the first time period T1 may be less than 30 milliseconds, and the second time period T2 may be less than 25 milliseconds, but it is not limited thereto. According to some embodiments, the alternately generated audio signal SA and haptic signal SH constitute a control signal SC that is provided to the piezoelectric element 130 so that the piezoelectric element 130 generates sound S and vibration V correspondingly. Since the hearing of the human ear has the persistence of hearing and the sense of touch also has the persistence of touching, the user may feel the continuity of sound and the continuity of vibration according to the design of the first time period and the second time period.

In summary, according to some embodiments of the disclosure, an electronic device includes a display element, a piezoelectric element, and a cushioning element disposed between the display element and the piezoelectric element. The vibration of the piezoelectric element 130 may provide the electronic device 100 with vibration of sound and haptic feedback. Therefore, the requirement of smaller size of the electronic device is achieved. Furthermore, since the sound is emitted from the display surface of the display element, the position where the sound is emitted tends to be consistent with the position where the image is displayed, which may further improve the user experience.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic device, comprising:
    a display element, having a display surface and a non-display surface, wherein the non-display surface faces away from the display surface;
    a piezoelectric element, disposed on the non-display surface; and
    a cushioning element, disposed between the display element and the piezoelectric element, wherein a space is defined by the display element, the piezoelectric element, and the cushioning element;
    wherein the cushioning element is divided by a plurality of sound holes into a plurality of cushioning units, the plurality of cushioning units are in a surrounding shape and surround the space, and the plurality of sound holes communicate with the space.
2. The electronic device as defined in claim 1, wherein the piezoelectric element comprises:

a first electrode;

a second electrode; and a piezoelectric material layer, disposed between the first electrode and the second electrode.

3. The electronic device as defined in claim 1, wherein the display element comprises:

a display module; and a backlight module, providing a light source to the display module, wherein the space is surrounded by the backlight module, the piezoelectric element, and the cushioning element.

4. The electronic device as defined in claim 1, further comprising:

a controller, receiving an audio signal and a haptic signal to generate a control signal and providing the control signal to the piezoelectric element.

5. The electronic device as defined in claim 4, wherein the controller superimposes the audio signal and the haptic signal to generate the control signal, wherein the piezoelectric element generates sound and vibration at the same time based on the control signal.

6. The electronic device as defined in claim 4, wherein the controller generates the control signal with the audio signal and the haptic signal generated alternately so that the piezoelectric element periodically generates sound and vibration correspondingly.

7. The electronic device as defined in claim 6, wherein the audio signal comprises a first signal part and a second signal part, and the haptic signal comprises a third signal part and a fourth signal part, wherein the first signal part, the third signal part, the second signal part, and the fourth signal part are arranged in the order of time.

8. The electronic device as defined in claim 7, wherein the first signal part and the second signal part are separated by a first time period.

9. The electronic device as defined in claim 8, wherein the third signal part and the fourth signal part are separated by a second time period.

10. A control method, comprising:

providing an electronic device as claimed in claim 1;

receiving an audio signal and a haptic signal to generate a control signal; and generating sound and vibration according to the control signal by using the piezoelectric element.

11. The control method as defined in claim 10, further comprising:

superimposing the audio signal and the haptic signal to generate the control signal.

12. The control method as defined in claim 10, further comprising:

alternately generating the audio signal and the haptic signal.

13. The control method as defined in claim 12, wherein the audio signal comprises a first signal part and a second signal part, and the haptic signal comprises a third signal part.

14. The control method as defined in claim 13, wherein the control method comprises:

sequentially generating the first signal part, the third signal part, and the second signal part.

15. The control method as defined in claim 14, wherein there is a first time period between the first signal part and the second signal part and the first time period is in the range of 5 milliseconds to 100 milliseconds.

16. The control method as defined in claim 14, wherein the haptic signal further comprises a fourth signal part.

17. The control method as defined in claim 16, wherein there is a second time period between the third signal part and the fourth signal part.

18. The control method as defined in claim 17, wherein the second time period is in the range of 5 milliseconds to 100 milliseconds.

19. The control method as defined in claim 14, wherein the sound and the vibration is sequentially generated in the order of the first signal part, the third signal part, the second signal part, and the fourth signal part by using the piezoelectric element.

* * * * *